(12) United States Patent
Schat et al.

(10) Patent No.: US 11,435,940 B2
(45) Date of Patent: Sep. 6, 2022

(54) TESTING A MEMORY WHICH INCLUDES CONSERVATIVE REVERSIBLE LOGIC

(71) Applicant: NXP B.V., Eindhoven (NL)

(72) Inventors: Jan-Peter Schat, Hamburg (DE); Mohamed Azimane, Eindhoven (NL)

(73) Assignee: NXP B.V., San Jose, CA (US)

( * ) Notice: Subject to any disclaimer, the term of this patent is extended or adjusted under 35 U.S.C. 154(b) by 40 days.

(21) Appl. No.: 17/248,661

(22) Filed: Feb. 2, 2021

(65) Prior Publication Data
US 2022/0244881 A1   Aug. 4, 2022

(51) Int. Cl.
| | |
|---|---|
| G06F 3/06 | (2006.01) |
| G11C 29/04 | (2006.01) |
| G11C 29/36 | (2006.01) |
| G11C 29/18 | (2006.01) |

(52) U.S. Cl.
CPC .......... G06F 3/0653 (2013.01); G06F 3/0604 (2013.01); G06F 3/0655 (2013.01); G06F 3/0679 (2013.01); G11C 29/04 (2013.01); G11C 29/36 (2013.01); G11C 2029/1802 (2013.01)

(58) Field of Classification Search
None
See application file for complete search history.

(56) References Cited

U.S. PATENT DOCUMENTS

| | | | | |
|---|---|---|---|---|
| 5,691,950 A | * | 11/1997 | McClure | G11C 7/1006 365/230.06 |
| 7,392,465 B2 | * | 6/2008 | Azimane | G11C 29/02 714/814 |
| 10,860,759 B2 | * | 12/2020 | Roetteler | G06F 30/327 |
| 11,112,458 B1 | * | 9/2021 | Schat | H03K 19/20 |
| 2006/0041798 A1 | * | 2/2006 | Cooke | G11C 29/38 714/718 |

OTHER PUBLICATIONS

Altun et al.: "Exploiting Reversible Computing for Latent-Fault-Free Error Detecting/Correcting CMOS Circuits", IEEE Access, vol. 6, Dec. 27, 2018, DOI: 10.1109/ACCESS.2018.2883833, pp. 74475-74484.
Feinstein et al.: "Prefix Parallel Adder Virtual Implementation in Reversible Logic", IEEE, 2007 IEEE Region 5 Technical Conference, Apr. 20-21, 2007, DOI: 10.1109/TPSD.2007.4380355, Fayetteville, AR, USA, pp. 74-80.

(Continued)

*Primary Examiner* — Phung M Chung

(57) ABSTRACT

An integrated circuit device includes an array of read/write memory cells, application logic circuitry, and address decoder circuitry coupled to receive input from the application logic circuitry and to provide output to the array of memory cells. The address decoder circuitry is reversible by having a bijective transfer function from the inputs to the outputs of the address decoder circuitry, and conservative by having the same number of 1's at the input and the output. During a test, the application logic circuitry provides a test value and test ancilla bits to the address decoder circuitry. During normal operation, the application logic circuitry provides an application memory address and constant ancilla bits to the address decoder circuitry.

20 Claims, 4 Drawing Sheets

(56) References Cited

OTHER PUBLICATIONS

James et al.: "Quick Addition of Decimals using Reversible Conservative Logic", 15th International Conference on Advanced Computing and Communications, IEEE Computer Society, DOI 10.1109/ADCOM.2007.94, Guwahati, Assam, India, pp. 191-196.
Potluri et al.: "Design of 2n×2m×1 Random Access Memory using Reversible Logic", IEEE International Conference on Recent Trends in Electronics Information Communication Technology, DOI: 10.1109/RTEICT.2016.7807961, May 20-21, 2016, Bangalore, India, pp. 913-917.
Sivadasan et al.: "NBTI Aged Cell Rejuvenation with Back Biasing and Resulting Critical Path Reordering for Digital Circuits in 28nm FDSOI", 2018 Design, Automation & Test in Europe Conference & Exhibition (DATE), DOI: 10.23919/DATE.2018.8342154, Dresden, Germany, pp. 997-998.
Swaminathan et al.: "Concurrent Testing of VLSI Circuits Using Conservative Logic", Proceedings, 1990 IEEE International Conference on Computer Design: VLSI in Computers and Processors, IEEE, DOI: 10.1109/ICCD.1990.130161, Sep. 17-19, 1990, Cambridge, MA, USA, pp. 60-65.
U.S. Appl. No. 16/999,419, Schat, Jan-Peter: "Testing an Integrated Circuit Having Conservative Reversible Logict", filed Aug. 21, 2020.

\* cited by examiner

| A | B | C | X | Y | Z |
|---|---|---|---|---|---|
| 0 | 0 | 0 | 0 | 0 | 0 |
| 0 | 0 | 1 | 0 | 1 | 0 |
| 0 | 1 | 0 | 0 | 0 | 1 |
| 0 | 1 | 1 | 0 | 1 | 1 |
| 1 | 0 | 0 | 1 | 0 | 0 |
| 1 | 0 | 1 | 1 | 0 | 1 |
| 1 | 1 | 0 | 1 | 1 | 0 |
| 1 | 1 | 1 | 1 | 1 | 1 |

TESTING A MEMORY WHICH INCLUDES CONSERVATIVE REVERSIBLE LOGIC

BACKGROUND

Field

This disclosure relates generally to test, and more specifically, to testing a memory which includes conservative reversible logic.

Related Art

Address decoders in memories are often very timing-critical in which even marginal defects in the decoder can lead to timing violations, resulting in the memory malfunctioning. The marginal defects could be due to latent manufacturing defects or due to aging, with the most critical aging mechanism being Bias Temperature Instability (BTI) in which charge carriers enter a metal oxide semiconductor field effect transistor's (MOSFET's) gate, resulting in threshold voltage (Vt) changes which reduce the speed of the transistor. Both p-type and n-type MOSFETs are affected by BTI stresses. For a p-type MOSFET, a low voltage at its gate causes BTI stress (resulting in a forward shift of the Vt) while a high voltage causes BTI recovery (resulting in a backwards shift of the Vt, back towards its initial value). The same effects occurs on an n-type MOSFET, except that a high voltage at its gate causes BTI stress and a low voltage causes BTI recovery.

In complementary metal oxide semiconductor (CMOS) circuits, both p-type and n-type MOSFETS are used to construct logic gates, and the BTI stresses on the devices affect propagation time of signals through the logic gates. Furthermore, BTI stresses (and thus Vt shifts) typically affect clock paths and data paths differently, which may result in a race condition between clock and data, causing violations in setup or hold times in the flop-flops at the end points of these data and clock paths. These violations can result in operation failure of the IC.

Due to functional safety requirements, Built-In Self-Test (BIST) in the field (post manufacture and assembly) is important for memories, including the address decoders in the memories which need to be tested for marginal delay faults. Today, advanced address decoder tests require a variety of different test patterns, which take additional chip area for storing or creating the test patterns and which requires significant execution time, during which execution of the application must be halted. Therefore, a need exists for improved testing of address decoders which can reliably identify timing violations.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Address decoders are timing-critical, in which even marginal defects can lead to timing violations. In one aspect, an address decoder is implemented using conservative reversible logic (using conservative reversible logic gates). The use of conservative reversible logic offers the possibility of 100% transition fault coverage. In one embodiment, a self-test of the address decoder is performed which allows for testing all possible memory addresses of the address decoder by performing a write access to only one memory address. This testing can be achieved, for example, by entering a test mode and providing a logic-one-vector at the inputs of the address decoder, which should result in an all logic ones at the outputs. Afterwards, a zero-vector is provided at the input of the address decoder, in which all outputs should transition to zeros. In this manner, the address decoder can be tested for propagation delay of the one-to-zero transition. This is performed by, after transitioning the inputs to the zero-vector, using logic gates to convert the outputs of the address decoder to a valid decoded memory address. For example, the logic gates can process a received decoded test address (corresponding to a test address within the memory that is most timing-critical) using the outputs of the address decoder to provide the valid decoded memory address.

While still in test mode, a write operation is performed using the processed decoded test address to write test data to the test address. The test data may also be referred to as "test background." Subsequently, either in test mode or during normal operation (i.e. normal mode or application mode), the test address is read (with non-critical timing) to determine if the read data matches the test data that was supposed to be written to the test address during test mode. If there is a match, then the address decoder provided the correct timing (i.e. the correct propagation delay for the one-to-zero transition) during the write operation having critical timing. However, a mismatch in the values indicates that a transition fault occurred within the address decoder during the write operation having critical timing. In one embodiment, this transition test for the address decoder can be performed for a zero-to-one transition instead of the one-to-zero transition, depending on which transition is more critical. In this manner, by writing test data to a single test address of the memory, the entire address decoder (implemented with conservative reversible logic) can be fully tested for a transition fault.

Figures 1A, 1B:
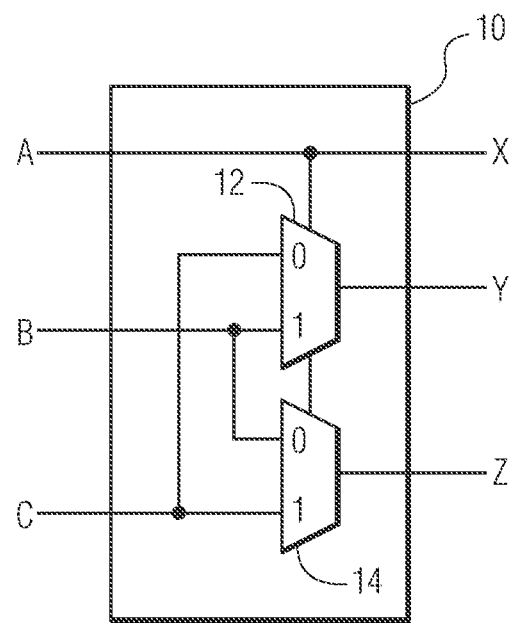
FIG. 1A illustrates, in schematic form, a known Fredkin gate.
FIG. 1B illustrates a truth table corresponding to the Fredkin gate of FIG. 1A.

FIGS. 1A and 1B illustrate an example of a conservative reversible gate, known as a Fredkin gate. A conservative gate is defined as a gate that has the same number of signals in a logic one state at the output and at the input. Conservative gates can be used to build conservative combinatorial logic, which correspondingly has the same number of logic ones at the output and the input. Reversible gates also have the same number of outputs and inputs, and additionally, they have a bijective transfer function, meaning that one can conclude unambiguously the gates' inputs from the outputs. Note that, for example, an AND gate does not have a bijective transfer function because an output of a logic zero can be a result of different combinations of inputs (e.g. any set of inputs where at least one input is a zero). A reversible circuit is constructed from reversible gates which are connected without fanouts and without feedback loops.

The conservative and reversible properties are independent from each other. That is, conservative logic is often, but not necessarily, reversible, and reversible logic is mostly not conservative. Combinatorial logic which is both conservative and reversible is referred to as conservative reversible logic. Conservative reversible logic in standard CMOS circuitry is often realized using Fredkin gates. FIG. 1A illustrates a Fredkin gate 10, which includes multiplexers (MUXes) 12 and 14. Fredkin gate 10 has three inputs, A, B, and C, and three outputs, X, Y, and Z. Input A is provided to the control input of each of MUXes 12 and 14, and is also provided directly as output X. A first input of MUX 12 is coupled to receive input C, a second input of MUX 14 is coupled to receive input B, and an output of MUX 12 provides output Y. A first input of MUX 14 is coupled to receive input B, a second input of MUX 14 is coupled to receive input C, and an output of MUX 14 provides output Z. When the control input of MUX 12 or 14 is a logic level zero, the first input of the MUX is provided as the output of the MUX, and when the control input of MUX 12 or 14 is a logic level one, the second input of the MUX is provided as the output of the MUX.

The resulting truth table for Fredkin gate 10 is provided in FIG. 1B, in which all the logic states are provided in binary form. Note that in each row, the inputs A, B, and C include a same number of logic ones as the corresponding outputs X, Y, and Z. For example, when ABC=010, then XYZ=001. That is, with A=0, each of MUX 12 and 14 selects the first input to provide as its outputs, therefore, MUX 12 provides C as Y (such that Y=0) and MUX 14 provides B as Z (such that Z=1). Also, each combination of outputs X, Y and Z corresponds to a unique combination of inputs A, B, C. For example, the output XYZ=001 is only obtained with inputs ABC=010, and no other combination of ABC provides output XYZ=001. This is true for all rows of the truth table. Note that Fredkin gate 10, with MUXes 12 and 14, can be implemented with standard CMOS core library cells.

Still referring to Fredkin gate 10, note that the logic function of an AND gate, OR gate, or inverter can be achieved with Fredkin gate 10. For example, by fixing B to the constant logic zero (in which B would be considered an "ancilla input"), the remaining variables implement an AND function. That is, with B fixed to zero, gate 10 provides an AND logic function in which Z=A AND C. In this case, X and Y are considered "garbage outputs" because they are not used for this function. Similarly, by fixing C to the constant logic one (in which C would now be considered an "ancilla input"), the remaining input signals implement an OR logic function in which Z=A OR B. In this case, X and Y again are considered "garbage outputs". Similarly, by fixing B to a logic zero and C to a logic one (in which both B and C are "ancilla inputs"), gate 10 provides an inverse logic function in which Y=NOT A. In this case, X and Z are considered "garbage outputs" since they are not used for this function. Since Fredkin gate 10 can be used to implement logic functions such as OR, AND, and an inverter (by fixing each ancilla input to a constant zero or a constant one to provide the desired logic function and ignoring garbage outputs), any combinatorial logic can be implemented using Fredkin gates. However, more area is generally required since both ancilla inputs and garbage outputs lead to wasted area.

When conservative reversible gates (e.g. Fredkin gates) are used to implement combinatorial logic without feedback paths, the resulting logic is conservative reversible logic (also referred to as a conservative reversible circuit). Note that in the case of any conservative reversible circuit, when an all-zero vector is applied at the inputs, all outputs of the circuit are also logic zero, and when an all-one vector is applied at the inputs, all outputs are also logic one. For example, as can be seen in FIG. 1B, when all logic zeros are applied as ABC, outputs XYZ are also all logic zeros, and when all logic ones are applied as ABC, outputs XYZ are also all logic ones. If Fredkin gates are used to implement a conservative reversible circuit, then when all inputs to the circuit are logic zero, all outputs should also be logic zero, and when all inputs are logic one, all outputs should also be logic one.

In the case of an address decoder of a memory (which may be implemented in a row decoder or column decoder), an incoming address can be decoded by the address decoder to produce a plurality of outputs (e.g. each output corresponding to one word line or bit line of the memory) in which each output can be a logic one or a logic zero. In one embodiment, a logic one activates (i.e. selects) a corresponding word line or bit line and a logic zero does not select the corresponding word line or bit line. Therefore, note that an output of all zeros or all ones of the address decoder is not a valid output for a memory access since either all word lines or bit lines or none of the word lines or bit lines will be selected.

In one embodiment, the logic used to decode the incoming memory address to the plurality of outputs (corresponding to the decoded address) is implemented as conservative reversible logic. During normal operation of the memory, for each incoming memory address, each ancilla bit needs to be set to a constant one or a constant zero as needed by the conservative reversible logic to obtain the correct decoded address. Also, garbage bits may be produced in addition to the decoded address. The decoded address is then used to access the appropriate memory location in the memory array of the memory for the read or write access (and the garbage bits may be ignored).

Figure 2:
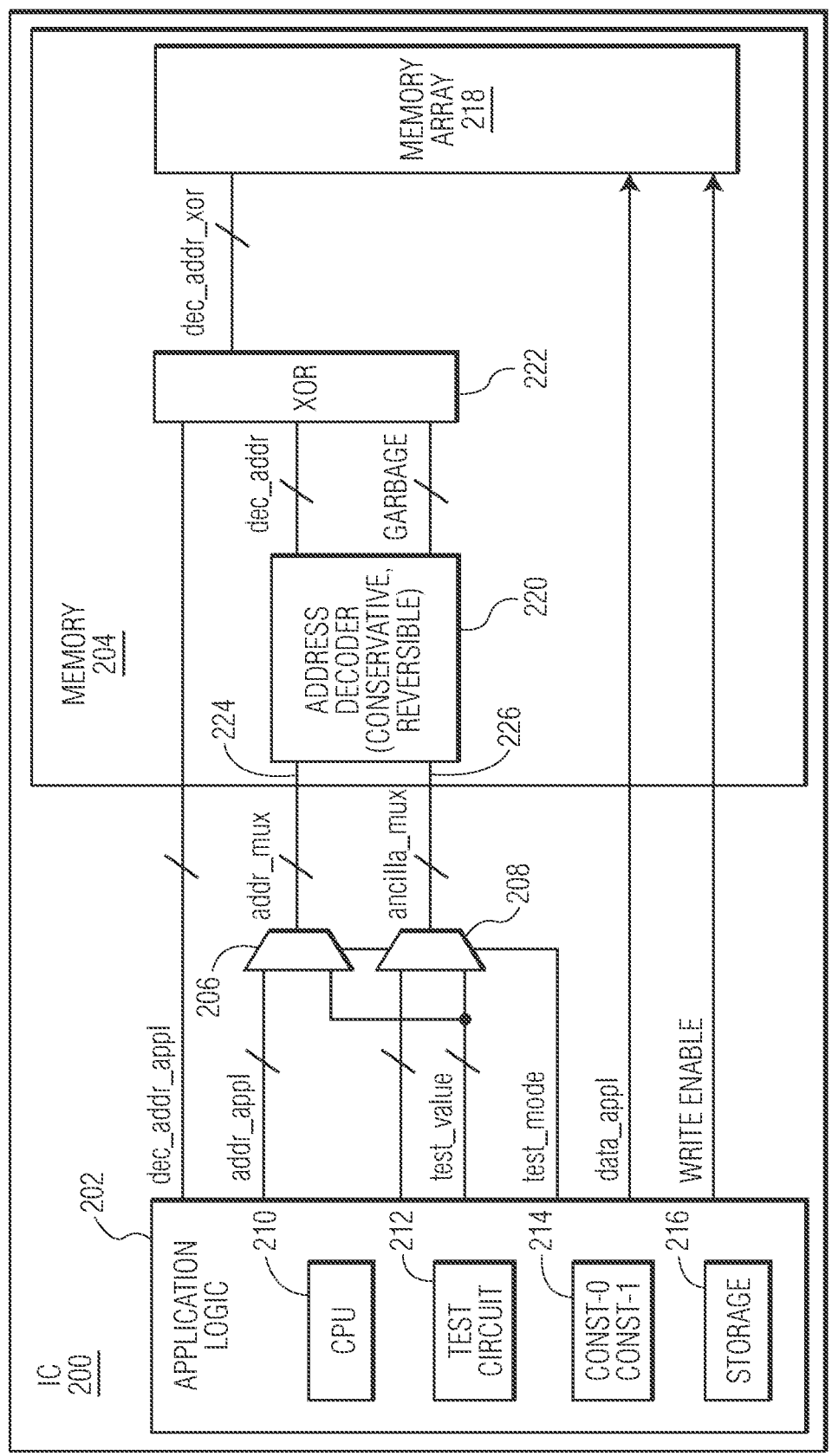
FIG. 2 illustrates, in block diagram form, an integrated circuit (IC) having a memory with an address decoder and corresponding testing circuitry, in accordance with one embodiment of the present invention.

FIG. 2 illustrates, in block diagram form, an integrated circuit (IC) 200 which includes application logic 202, multiplexers (MUXes) 206 and 208, and a memory 204. Application logic 202 is coupled to MUXes 206 and 208 and to memory 204, and MUXes 206 and 208 are coupled to memory 204. Application logic 202 includes a processor 210 (e.g. a central processing unit (CPU)), a test circuit 212, a constant-zero/constant-one circuit (const-0/const-1) 214, and storage circuitry 216. Processor 210 may also be referred to as a processor unit and may be configured to execute application code. Application logic 202 may include more circuitry than that illustrated in FIG. 2, such as any circuitry needed to perform any of the functions or applications of IC 200. Each of MUXes 206 and 208 provides one of two data inputs as the output, depending on the value of the control input. Any selection circuitry may be used to implement the functions of the MUXes. In the illustrated embodiment, MUX 206 receives a memory address (addr_appl) from application logic 202 (such as from CPU 210) at a first data input, a test value (test_value) from application logic 202 (such as from test circuit 212) at a second data input, and a test mode indicator (test_mode) from application logic 202 (such as from test circuit 212) at a control input. MUX 208 receives ancilla bits from application logic 202 (such as from const-0/const-1 214) at a first data input, test_value at a second data input (in which the test_value provided to MUX 208 can also be referred to as the test ancilla bits), and test_mode at a control input. With test_mode negated (at a logic level zero), MUX 206 provides addr_appl as addr_mux to address decoder 220, and MUX 208 provides the ancilla bits from application logic 202 as ancilla_mux to decoder 220. With test_mode asserted (at a logic level one), MUX 206 provides test_value as addr_mux to address decoder 220, and MUX 208 provides test_value as ancilla_mux to decoder 220.

Memory 204 can be any type of memory which is both writeable and readable, such as, for example, volatile memory (e.g. static random access memory (SRAM), etc.), or non-volatile memory (NVM) (e.g. flash memory, resistive random access memory (ReRAM), magnetoresistive random access memory (MRAM), etc.) Memory 204 includes a memory array 218, in which array 218 includes a plurality of memory cells configured to store a plurality of bits. In one embodiment, memory array 218 includes a M word lines and N bit lines, in which a memory cell is located at each intersection of a word line and bit line and is capable of storing a memory bit (at a logic one or logic zero). For a read access or a write access to memory array 218, a corresponding memory access address is provided (e.g. by CPU 210) which is used to select the appropriate word line and bit lines of array 218 for the read or write access. Memory 204 also includes an address decoder 220 which, during normal operation, is configured to decode a memory access address (e.g. addr_appl from CPU 210) into a decoded address (dec_addr) which selects the appropriate word line and bits lines coupled to the bit cells of array 218 selected by the memory access address. Therefore, in one embodiment, address decoder 220 may be a row decoder (e.g. word line decoder) or a column decoder (e.g. bit line decoder), or may be both the row and column decoder for memory 204.

In the illustrated embodiment, address decoder 220 is implemented with conservative reversible logic. Address decoder 220 has a first input 224 to receive an access address (in which the address bits of the access address may be referred to as the functional inputs) and a second input 226 to receive ancilla bits. The access address is received as addr_mux from MUX 206, and the ancilla bits are received as ancilla_mux from MUX 208 (the ancilla bits, and thus ancilla_mux, may include any number of bits, as needed, depending on the implementation of the conservative reversible logic). As discussed above with the example of FIGS. 1A and 1B, the use of conservative reversible logic requires ancilla bits in which each ancilla bit is set to constant one or constant zero (by const-0/const-1 214), as needed, so as to perform the correct logic function on the functional inputs.

During normal operation of the memory (in which test_mode is negated or tied to a logic level zero), for each incoming memory address (addr_appl provided as addr_mux to decoder 220), each ancilla bit (provided as ancilla_mux to decoder 220) needs to be set to a constant one or a constant zero as needed by the conservative reversible logic to obtain the correct decoded address. Also, garbage bits (garbage) may be produced in addition to the decoded address (dec_addr) at the output of decoder 220. The decoded address is then used to access the appropriate memory location in the memory array of the memory for the read or write access. Memory 204 includes a logic circuit 222 coupled between the output of address decoder 220 and memory array 218, in which logic circuit 222 receives a first input (dec_addr_appl from application logic 202, such as from CPU 210 or test circuit 212) and a second input (dec_addr and garbage from decoder 222). During normal operation, logic circuit 222 provides the output of decoder 220 (dec_addr) to array 218 unchanged (as dec_addr_xor).

In test mode, logic circuit 222 processes dec_addr_appl with the outputs of decoder 220 to provide the processed dec_addr_appl as dec_addr_xor.

In one embodiment, logic circuit 222 includes an exclusive-OR (XOR) gate for each output bit of address decoder 220 (including each bit of dec_addr and garbage). The number of bits in dec_addr_appl (e.g. 20 bits) therefore matches the total number of bits in dec_addr (e.g. 16) and garbage (e.g. 4). In this embodiment, during normal operation, dec_addr_appl is provided as all zeros such that XOR gates XOR each bit of dec_addr and each bit of garbage with zero, so as to provide dec_addr directly as dec_addr_xor (since dec_addr_xor=dec_addr XOR 0=dec_addr).

However, during testing, test_mode is asserted to a logic level one, and test circuit 212 provides the appropriate test_value and dec_addr_appl (which is a decoded test address corresponding, for example, to a decoded version of a test address that is the most time critical memory address in memory array 218). The test_value is provided as either a vector of ones or a vector of zeros. If the test_value is a vector of ones (which are provided via MUXes 206 and 208 as addr_mux and ancilla_mux to inputs 224 and 226 of decoder 220), then dec_addr and garbage should all be ones due to the conservative reversible logic of decoder 220. Similarly, if the test_value is a vector of zeros, then dec_addr and garbage should all be zeros. By providing the test_value as first a vector of ones followed next by a vector of zeros, the transition of one to zero in decoder 220 can be fully tested. If decoder 220 is operating correctly, upon transitioning the test_value from the vector of ones to the vector of zeros, the outputs of address decoder 220 should transition from ones to zeros within the propagation limits of memory 204 (thus adhering to the critical timing requirements of decoder 220). If the inputs to the XOR gates of logic circuit 222 are all zeros, then the decoded test address (the value of dec_addr_appl) is provided as dec_addr_xor to memory array 218 since "0 XOR A=A". If decoder 220 is not operating correctly, then the transitions from one to zero do not all propagate correctly, and operation of memory 204 fails because dec_addr_appl will not equal dec_addr_xor. This aspect is tested by transitioning test_value from a vector of ones to a vector of zeros, followed by a write of test data (data_appl) to the memory location corresponding to the decoded test address, dec_addr_appl. If this write is successful, then it can be assumed that there are no one-to-zero transition faults in decoder 220. If this write fails, then it can be assumed that there is at least one one-to-zero transition fault in decoder 220.

Figure 3:
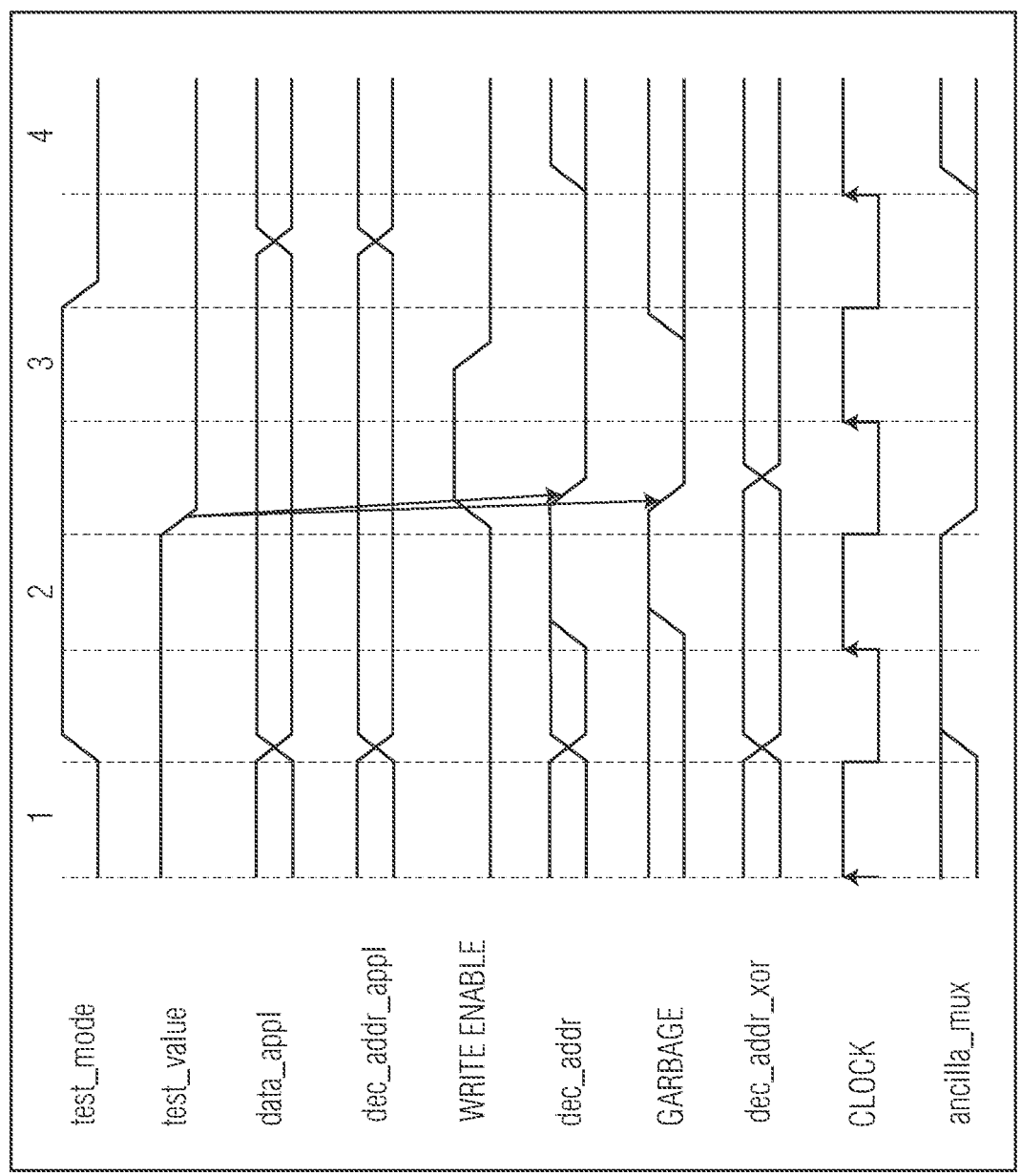
FIG. 3 illustrates a timing diagram for various signals in the IC of FIG. 2, in accordance with one embodiment of the present invention.

Operation of IC 200 during test mode will be described further in reference to the timing diagram of FIG. 3, which illustrates the values of various signals within IC 200 in accordance to one embodiment of the present invention. In FIG. 3, periods of time are indicated across the top, labeled 1-4. These may be referred to as cycles and correspond to cycles of a clock within IC 200, labeled in FIG. 3 as CLOCK. During test mode, this clock may have a different frequency than the frequency used during normal operation. In cycle 1 (corresponding to the first clock cycle of CLOCK), IC 200 begins in normal operation with test_mode set to a logic level zero. During normal operation, as discussed above, dec_addr_appl can be set to zeros so that logic circuit 222 provides dec_addr as dec_addr_xor to memory array 218 for normal read and write accesses. Note that additional control circuitry and signals can be present in IC 200 and memory 204 to provide the full functionality of IC 200 and memory 204, but only a subset are illustrated in FIGS. 2 and 3 to the extent necessary to explain embodiments of the invention.

Within cycle 1 (about halfway through cycle 1), test_mode is asserted to logic level one to enter test mode. This begins the self testing of address decoder 220. Note that during test mode, normal operation of memory 204 is suspended (i.e. paused). Therefore, it is desirable to perform the testing operations as quickly as possible. When test mode is entered, dec_addr_appl (the decoded test address), data_appl (the test data for the write to the test address), and test_value can be set by test circuit 212. As discussed above, the test address and test data may correspond to the most critical timing address of memory array 218 and the most critical data word, respectively. Alternatively, any test address and test data may be used, as desired. Also, note that in test mode the test address is provided in its decoded form as the decoded test address, dec_addr_appl. In one embodiment, test circuit 212 includes a state machine which controls the testing operations, providing the testing values as needed, in which the testing values (e.g. test_value, test address, decoded test address, test data, etc.) can be stored in storage circuitry 216 (e.g. within registers accessible by CPU 210 during test operation or normal operation). Test circuit 212 may also be controlled by CPU 210. In the illustrated embodiment, in this first test phase, test_value is first set to ones which is provided to decoder 220. Note that the timing of these signals is not critical and each may be set by test circuit 212 before entering test mode.

Upon the rising clock edge of cycle 2, the ones provided as the test_value in cycle 1 (provided as ancilla_mux and addr_mux to decoder 220) propagate through decoder 220 such that dec_addr and garbage become all ones as well. Within cycle 2 (in a second test phase), test circuit 212 sets test_value to all zeros (a vector of zeros). Therefore, zeros are provided via ancilla_mux and addr_mux to decoder 220 such that dec_addr and garbage, at the output of decoder 220, transition to all zeros. Logic circuit 222 processes the received decoded test address (dec_addr_appl) using the outputs of decoder 220. In the case the outputs are all zeros (and logic circuit 222 is implemented with XOR gates as described above), the resulting processed decoded test address is the same as the received decoded test address (i.e. dec_addr_xor=dec_addr_appl). The processed decoded test address is provided to array 218. Also within cycle 2 (prior to cycle 3), write enable is asserted to a logic level one.

Upon the rising clock edge of cycle 3, with write enable asserted to a logic level one, data_appl (the test data) gets written to the memory location corresponding to dec_addr_xor (the processed decoded test address) in array 218. This write may also be considered part of the second test phase. Within cycle 3, test_mode gets negated again. Also write_enable is negated prior to cycle 4. With test_mode negated, memory 204 returns to normal operation in which dec_addr_appl is set to zeros, addr_appl is provided to decoder 220 via addr_mux, and the ancilla bits are provided to decoder 220 via ancilla_mux.

At some point after returning to normal operation (to normal mode), the address location of memory 204 corresponding to the test address is read, and the read data returned from array 218 is compared to the test data which was provided for the write during test mode. Note that since this read is performed during normal operation, the test address is provided by application logic 202 as addr_appl to MUX 206, which, along with the appropriate ancilla bits provided to MUX 208, are provided to address decoder to obtain dec_addr, which is provided unchanged as dec_addr_xor to array 218, as was described above.) In order for the test data (data_appl) to have been properly stored at the test address (corresponding to dec_addr_appl) during testing, all outputs of decoder 220 must have transitioned from one to zero correctly, within allowed timing margins for memory 204. Only if the one to zero transition is correctly performed, is the output decoder 220 properly set to all zeros, allowing logic circuit 222 to provide the value of dec_addr_appl as dec_addr_xor. In this case, upon a subsequent read access from the test address (corresponding to dec_addr_appl that was provided during testing), the correct test data is recovered (i.e. the read data=the test data). This indicates that decoder 220 had no one-to-zero transition faults.

However, if during testing, any of the outputs of decoder 220 did not transition properly (prior to the write operation), then data_appl would not have been written into the memory location corresponding to the decoded test address (provided as dec_addr_appl during testing) because dec_addr_xor did not equal dec_addr_appl as it was supposed to. Instead, data_appl may have been written to some other decoded address based on dec_addr_appl or may have resulted in a failed write operation. Therefore, upon a read from the test address, the correct test data stored during the test as data_appl would not be recovered (i.e. the read data does not equal the test data), indicating at least one transition fault occurred within decoder 220. Note that, in this embodiment, the read operation is performed in normal mode, after exiting test mode, using non-critical timing. Alternatively, the read operation can be performed while still in test mode, however, it may not be desirable to make the test mode longer. That is, there is more time available to perform the read operation if done during normal operation outside of test mode. Also, note that to perform the read operation during test mode, additional modifications may be required during test mode, such as allowing more time to ensure that the transition of the test_value fully propagates through decoder 220. Note also that regardless of whether the read operation is performed in normal mode or test mode, it may be referred to as a third test phase.

Figure 4:
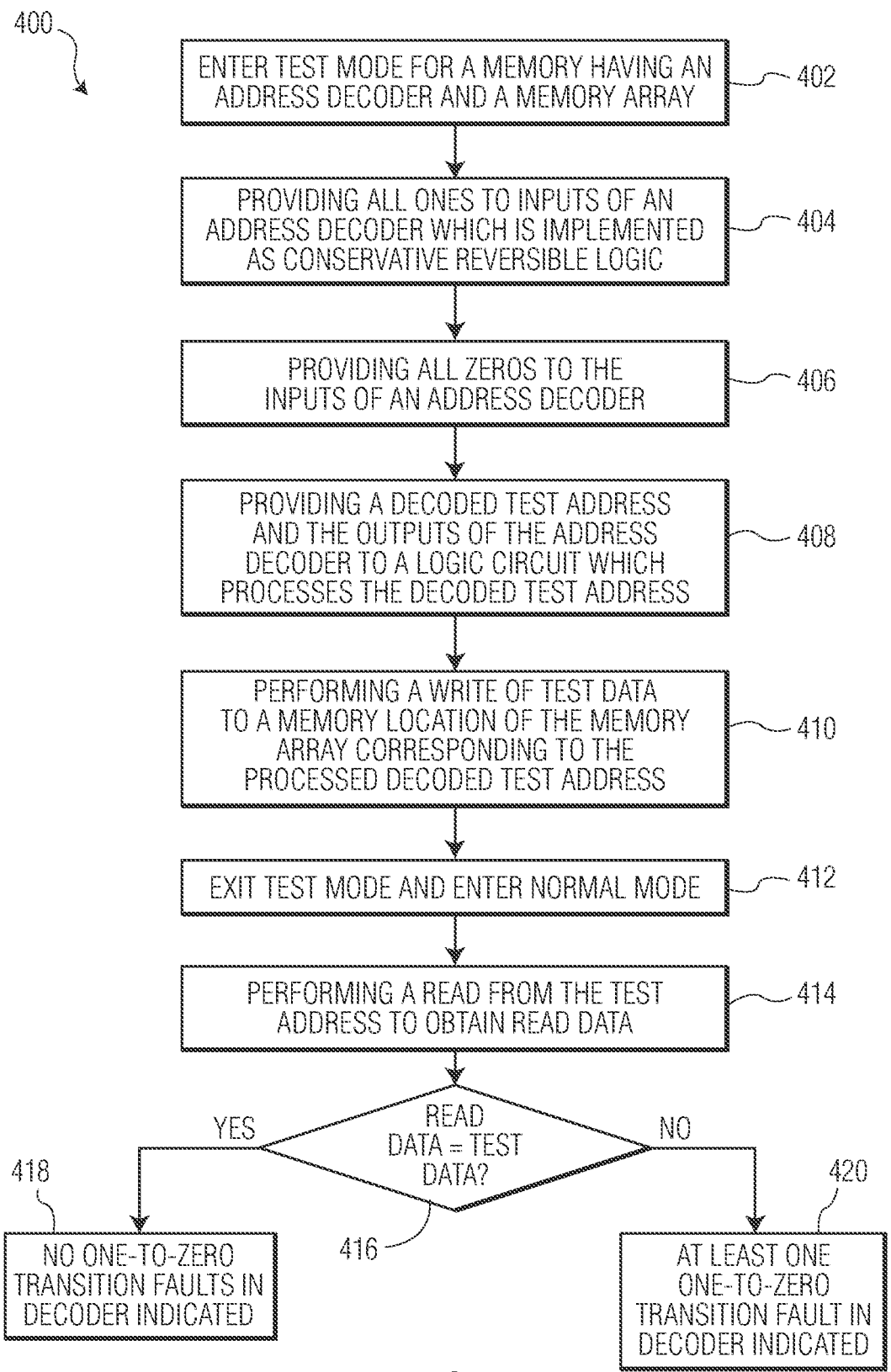
FIG. 4 illustrates, in flow diagram form, a method of operating the IC of FIG. 2, in accordance with one embodiment of the present invention.

FIG. 4 illustrates, in flow diagram form, a method 400 for testing an address decoder (e.g. 220) implemented with conservative reversible logic in accordance with one embodiment of the present invention. Method 400 begins by entering (402) test mode for a memory (e.g. 204) having an address decoder (e.g. 220) implemented with conservative reversible logic and a memory array (e.g. 218). A one-vector (all ones) is provided to the inputs of the address decoder (404), and subsequently, a zero-vector (all zeros) is provided to the inputs of the address decoder (406). A logic circuit (e.g. 222) receives a decoded test address (e.g. dec_addr_appl) for the memory array from a test circuit (e.g. 212) or a processor (e.g. CPU 210) external to the memory. The logic circuit processes (408) the received decoded test address using the outputs of the address decoder (e.g. dec_addr and garbage) to provide a processed decoded test address (e.g. dec_addr_xor) to the memory array. As described above, the logic circuit can include an XOR gate which processes each bit of the decoded test address and a corresponding output bit of the address decoder to provide a corresponding bit of the processed decoded test address. Next, a write operation is performed (e.g. with critical timing) to write test data to a memory location of the memory array corresponding to the processed decoded test address (410). The test mode can then be exited (412) so as to enter normal mode (i.e. return to normal operation).

Still referring to FIG. 4, during normal operation, a read operation (414) is performed (e.g. with non-critical timing) from the test address to obtain read data (in which the test address is provided as addr_appl, via MUX 206, to address decoder 220). At decision diamond 416, if the read data matches the test data, then no one-to-zero transition faults in the decoder is indicated (418). However, if the read data does not match the test data, at least one one-to-zero transition fault in the decoder is indicated (420). As described in reference to FIG. 3, in an alternate embodiment, more functionality can be included in the test mode, in which block 414 can be performed during test mode, as can the check of decision diamond 416.

Although the above descriptions of FIGS. 3 and 4 referred to performing a one to zero transition test for address decoder 220, a similar method can be applied to perform a zero-to-one transition test. For example, during test mode, instead of providing a one-vector as the test_value followed by a zero-vector as the test_value prior to performing the write operation, a zero-vector can first be provided followed by the one-vector to perform a zero-to-one transition test. Also, in order for logic circuit 222 to properly process the decoded test address, the decoded test address is instead provided as the inverse of the decoded test address (dec_addr_appl', where the apostrophe following the name of the value indicates the inverse of the value) in which each bit of the decoded test address is inverted prior to providing the value to logic circuit 222. This inversion can be performed by CPU 210 or test circuit 212, or a separate value for the inverted decoded test address can be stored in storage 216. (The rest of the description for FIGS. 3 and 4 can therefore remain unchanged for the zero-to-one transition testing.)

In the embodiment of FIG. 3, in which logic circuit 222 is implemented with bit-wise XOR gates to process dec_addr_appl to provide dec_addr_xor, using zeros from the output of decoder 220 properly processes dec_addr_appl since "0 XOR A=A." Similarly, for testing the zero-to-one transition, using ones from the output of decoder 220 properly processes dec_addr_appl' since "1 XOR A'=A." In alternate embodiments, different logic can be used for logic circuit 222 to process the decoded test address such that, when the outputs of decoder 220 are correctly provided, dec_addr_appl=dec_addr_xor. Also, in one embodiment, both transitions may be tested by first testing for zero-to-one transition faults and then testing for one-to-zero transition faults (or vice versa).

In some embodiments, additional actions may be taken for test mode or while in test mode. For example, the data stored at any test address may be stored prior to testing, and then restored after testing. Also, upon entry into test mode, any test address may first be initialized to a known predetermined value, such as all zeros. However, note that any additional actions taken while in test mode increases the testing duration, which may not be acceptable or may need to be minimized in some applications, such as in the framework of functional safety.

Therefore, by now it can be appreciated how, through the use of a conservative reversible memory address decoder, complete transition fault coverage can be obtained in the field. This can be achieved in a test mode by applying a first logic state vector to the inputs of the decoder followed by applying a second logic state vector, opposite the first logic state, to the inputs of the decoder. Then a write operation can be performed (which may use critical timing) to write test data to a test address. Subsequently a read access (which may use non-critical timing) is performed from the test address, and the obtained read data is compared with the test data which was written during test mode. A match indicates that no transition faults from the first logic state to the second logic state occurred in the decoder. In this manner, all possible addresses of the address decoder can be tested for transition faults from the first logic state to the second logic state by performing a write access to only one memory address.

Although greater overhead is required in terms of area and power to implement conservative reversible logic, there are applications in which it is critical to ensure 100% detection of transition faults caused, for example, by BTI stresses over time. For example, these applications may include security-relevant memories (e.g. memories that are embedded in logic that restricts access or grants privileges, computes challenge-response pairs, etc.) or safety-relevant memories (e.g. memories used in safety-critical logic, especially for logic in which a failure may endanger human lives).

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 2 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, a different ordering may be used to apply the all-one and all-zero test vectors. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit includes an array of read/write memory cells; application logic circuitry; and address decoder circuitry coupled to receive input from the application logic circuitry and to provide output to the array of memory cells. The address decoder circuitry is reversible by having a bijective transfer function from the inputs to the outputs of the address decoder circuitry, and conservative by having the same number of 1's at the input and the output. During a test, the application logic circuitry provides a test value and test ancilla bits to the address decoder circuitry, and, during normal operation, the application logic circuitry provides an application memory address and constant ancilla bits to the address decoder circuitry. In one aspect of the embodiment, the integrated circuit further includes a first multiplexer coupled between the application logic circuitry and the address decoder circuitry, the first multiplexer configured to provide the application memory address to the address decoder during the normal operation and to provide the test value to the address decoder circuitry during the test. In a further embodiment, the integrated circuit further includes a second multiplexer coupled between the application logic circuitry and the address decoder circuitry, the second multiplexer configured to provide the constant ancilla bits to the address decoder circuitry during the normal operation and to provide the test ancilla bits to the address decoder circuitry during the test. In yet a further aspect, the integrated circuit further includes an XOR logic circuit coupled between the address decoder circuitry and the array of read/write memory cells, in which the XOR logic circuit is configured to receive a decoded application memory address from the application logic circuitry as well as an output from the address decoder circuitry, and configured to output a decoded address that is used to access the array of read/write memory cells. In a further aspect, the application logic circuit is configured to, during a first phase of the test, set all bits in the test value to a first binary value, and set the decoded application memory address to a decoded version of a test address of the array of read/write memory cells to be used for write access during the test, and, during a second phase of the test, set all bits in the test value to a second binary value that is opposite the first binary value. In yet a further aspect, the application logic circuitry is further configured to, during the second phase of the test, write data to a memory location corresponding to the decoded address output by the XOR logic circuit, wherein the write is performed using a critical timing, and, during a third phase of the test, read data from the test address of the array of read/write memory cells, wherein the read is performed using a non-critical timing. In another aspect, the application logic circuitry is configured to, during the test, provide a test value with all bits set to one to the address decoder circuit in a first phase of the test, during the test, provide a test value with all the bits set zero to the address decoder circuit and write a data value to a memory location corresponding to the decoded address in the array of read/write memory cells in a second phase of the test, and, prior to the second phase of the test, set the decoded application memory address to a decoded version of a test address of the array of read/write memory cells. In a further embodiment, the application logic circuitry is configured to, after the test, read the data value from the test address of the array of read/write memory cells and compare the read data value to the data value written to the array of read/write memory cells during the test, and when the read data value is not equal to the written data value, indicate a fault in the address decoder. In another aspect of the one embodiment, the address decoder circuitry is implemented using Fredkin gates.

In another embodiment, a method for testing aging effects in an integrated circuit includes, during a test mode: setting all bits in a test value provided as input to an address decoder circuit to a first binary value; after a predetermined time, setting all bits in the test value provided as input to the address decoder circuit to a second binary value different than the first binary value; processing an output of the address decoder circuit and a decoded test address in a logic circuit, wherein, in the test mode, the decoded test address is set to a decoded version of a test address in a memory device; providing a decoded address from the logic circuit; and writing a data value at a memory location corresponding to the decoded address in the memory device. The method further comprises, once the test mode is finished: reading contents of the memory device at the test address using a non-critical timing scheme, comparing the data value to the contents read at the test address, and indicating a fault when the data value does not match the contents read at the test address. In one aspect, the logic circuit is bitwise XOR logic, and the method further includes, during normal operating mode, the decoded test address is set to all zeros (0). In another aspect, the method further includes providing test ancilla bits to the address decoder circuit during the test mode. In a further aspect, the method further includes providing constant values for the ancilla bits to the address decoder circuit during normal operating mode. In another aspect, the address decoder circuit is implemented using Fredkin gates. In yet another aspect, the decoded address from the logic circuit has critical timing attributes.

In yet another embodiment, a processing system includes application logic circuitry including a processor unit configured to execute application code, address decoder circuitry coupled to receive output from the application logic circuitry, wherein the address decoder circuit is reversible and conservative, an exclusive OR logic circuit configured to receive an output from the address decoder circuitry and a decoded application address from the application logic circuitry, and a memory array coupled to receive a decoded address output by the exclusive OR logic circuit. The application logic is configured to, during a first phase of a test mode, output a test value with all bits set to a first binary value, and, during a second phase of the test mode, output the test value with all bits of the test value set to a second binary value that is different than the first binary value, and write a data value to the memory array at a memory location corresponding to the decoded address output by the exclusive OR logic. The application logic circuitry is also configured to, prior to the second phase of the test mode, set the decoded application address to a decoded version of a test address of the memory array, and, at the end of the test mode, read contents of the memory array from the test address and compare the contents to the data value to determine whether the address decoder circuitry is operating correctly. In one aspect, the processing system further includes a first multiplexer coupled between the application logic circuitry and the address decoder circuitry, the first multiplexer configured to provide the application memory address to the address decoder during the normal operation and to provide the test value to the address decoder circuitry during the test. In another aspect, the processing system further includes a second multiplexer coupled between the application logic circuitry and the address decoder circuitry, the second multiplexer configured to provide constant ancilla bits to the address decoder circuitry during normal operation and to provide test ancilla bits to the address decoder circuitry during the first and second phases of the test mode. In another aspect, the application logic circuitry is further configured to, at the end of the test mode, set all bits of the decoded application address to the second binary value and outputs an application address instead of the test value to the address decoder circuitry. In a further aspect, the second binary value is zero and the first binary value is one.

What is claimed is:

1. An integrated circuit device comprising:
   an array of read/write memory cells;
   application logic circuitry;
   address decoder circuitry coupled to receive input from the application logic circuitry and to provide output to the array of memory cells, wherein:
      the address decoder circuitry is reversible by having a bijective transfer function from the inputs to the outputs of the address decoder circuitry, and conservative by having the same number of 1's at the input and the output;
      during a test, the application logic circuitry provides a test value and test ancilla bits to the address decoder circuitry; and
      during normal operation, the application logic circuitry provides an application memory address and constant ancilla bits to the address decoder circuitry.

2. The integrated circuit device of claim 1 further comprising:
   a first multiplexer coupled between the application logic circuitry and the address decoder circuitry, the first multiplexer configured to provide the application memory address to the address decoder during the normal operation and to provide the test value to the address decoder circuitry during the test.

3. The integrated circuit device of claim 2 further comprising:
   a second multiplexer coupled between the application logic circuitry and the address decoder circuitry, the second multiplexer configured to provide the constant ancilla bits to the address decoder circuitry during the normal operation and to provide the test ancilla bits to the address decoder circuitry during the test.

4. The integrated circuit device of claim 3 further comprising:
   an XOR logic circuit coupled between the address decoder circuitry and the array of read/write memory cells, the XOR logic circuit configured to receive a decoded application memory address from the application logic circuitry as well as an output from the address decoder circuitry, and to output a decoded address that is used to access the array of read/write memory cells.

5. The integrated circuit device of claim 4, wherein the application logic circuitry is configured to:
   during a first phase of the test, set all bits in the test value to a first binary value, and set the decoded application memory address to a decoded version of a test address of the array of read/write memory cells to be used for write access during the test; and
   during a second phase of the test, set all bits in the test value to a second binary value that is opposite the first binary value.

6. The integrated circuit device of claim 5 wherein application logic circuitry is further configured to:
   during the second phase of the test, write data to a memory location corresponding to the decoded address output by the XOR logic circuit, wherein the write is performed using a critical timing; and
   during a third phase of the test, read data from the test address of the array of read/write memory cells, wherein the read is performed using a non-critical timing.

7. The integrated circuit device of claim 4 wherein:
   the application logic circuitry is configured to:
      during the test, provide a test value with all bits set to one to the address decoder circuit in a first phase of the test;
      during the test, provide a test value with all the bits set zero to the address decoder circuit and write a data value to a memory location corresponding to the decoded address in the array of read/write memory cells in a second phase of the test; and prior to the second phase of the test, set the decoded application memory address to a decoded version of a test address of the array of read/write memory cells.

8. The integrated circuit device of claim 7 wherein:
the application logic circuitry is configured to, after the test:
    read the data value from the test address of the array of read/write memory cells and compare the read data value to the data value written to the array of read/write memory cells during the test; and
    when the read data value is not equal to the written data value, indicate a fault in the address decoder.

9. The integrated circuit device of claim 1 wherein:
the address decoder circuitry is implemented using Fredkin gates.

10. A method for testing aging effects in an integrated circuit, comprising:
during a test_mode:
    setting all bits in a test value provided as input to an address decoder circuit to a first binary value;
    after a predetermined time, setting all bits in the test value provided as input to the address decoder circuit to a second binary value different than the first binary value;
    processing an output of the address decoder circuit and a decoded test address in a logic circuit, wherein, in the test_mode, the decoded test address is set to a decoded version of a test address in a memory device;
    providing a decoded address from the logic circuit;
    writing a data value at a memory location corresponding to the decoded address in the memory device; and
once the test_mode is finished,
    reading contents of the memory device at the test address using a non-critical timing scheme;
    comparing the data value to the contents read at the test address; and
    indicating a fault when the data value does not match the contents read at the test address.

11. The method of claim 10 wherein the logic circuit is bitwise XOR logic, the method further comprising, during normal operating mode, the decoded test address is set to all zeros.

12. The method of claim 10 further comprising:
providing test ancilla bits to the address decoder circuit during the test_mode.

13. The method of claim 12 further comprising:
providing constant values for the ancilla bits to the address decoder circuit during normal operating mode.

14. The method of claim 10 wherein:
the address decoder circuit is implemented using Fredkin gates.

15. The method of claim 10 wherein:
the decoded address from the logic circuit has critical timing attributes.

16. A processing system comprising:
application logic circuitry including a processor unit configured to execute application code;
address decoder circuitry coupled to receive output from the application logic circuitry, wherein the address decoder circuit is reversible and conservative;
an exclusive OR logic circuit configured to receive an output from the address decoder circuitry and a decoded application address from the application logic circuitry;
a memory array coupled to receive a decoded address output by the exclusive OR logic circuit,
wherein, the application logic circuitry is configured to:
    during a first phase of a test_mode, output a test value with all bits set to a first binary value;
    during a second phase of the test_mode, output the test value with all bits of the test value set to a second binary value that is different than the first binary value, and write a data value to the memory array at a memory location corresponding to the decoded address output by the exclusive OR logic;
    prior to the second phase of the test_mode, set the decoded application address to a decoded version of a test address of the memory array;
    at the end of the test_mode, read contents of the memory array from the test address and compare the contents to the data value to determine whether the address decoder circuitry is operating correctly.

17. The processing system of claim 16 further comprising:
a first multiplexer coupled between the application logic circuitry and the address decoder circuitry, the first multiplexer configured to provide the application memory address to the address decoder during the normal operation and to provide the test value to the address decoder circuitry during the test.

18. The processing system of claim 16 further comprising:
a second multiplexer coupled between the application logic circuitry and the address decoder circuitry, the second multiplexer configured to provide constant ancilla bits to the address decoder circuitry during normal operation and to provide test ancilla bits to the address decoder circuitry during the first and second phases of the test_mode.

19. The processing system of claim 16 wherein the application logic is further configured to, at the end of the test_mode, set all bits of the decoded application address to the second binary value and outputs an application address instead of the test value to the address decoder circuitry.

20. The processing system of claim 19 wherein:
the second binary value is zero and the first binary value is one.

* * * * *